(12) United States Patent
Aoyagi et al.

(10) Patent No.: US 10,650,710 B2
(45) Date of Patent: May 12, 2020

(54) DISPLAY BODY DEVICE AND DISPLAY APPARATUS WITH IMPROVED ELECTROSTATIC WITHSTANDING VOLTAGE

(71) Applicant: SONY CORPORATION, Tokyo (JP)

(72) Inventors: Akiyoshi Aoyagi, Kanagawa (JP); Makio Iida, Tokyo (JP); Norifumi Hoshino, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/080,384

(22) PCT Filed: Jan. 30, 2017

(86) PCT No.: PCT/JP2017/003097
§ 371 (c)(1),
(2) Date: Aug. 28, 2018

(87) PCT Pub. No.: WO2017/154400
PCT Pub. Date: Sep. 14, 2017

(65) Prior Publication Data
US 2019/0019436 A1 Jan. 17, 2019

(30) Foreign Application Priority Data
Mar. 8, 2016 (JP) .................. 2016-044473

(51) Int. Cl.
*G09F 9/33* (2006.01)
*H05K 1/02* (2006.01)
(Continued)

(52) U.S. Cl.
CPC .................. *G09F 9/33* (2013.01); *G09F 9/40* (2013.01); *G09G 3/20* (2013.01); *H01L 27/124* (2013.01);
(Continued)

(58) Field of Classification Search
CPC .... G09F 9/33; G09F 9/40; G09G 3/20; H01L 27/124; H01L 27/15
See application file for complete search history.

(56) References Cited

U.S. PATENT DOCUMENTS

2011/0001146 A1  1/2011  Yamazaki et al.
2018/0217465 A1* 8/2018  Nagata ................ G02F 1/13338

FOREIGN PATENT DOCUMENTS

CN   106133815 A   11/2016
EP   3128505 A    2/2017
(Continued)

OTHER PUBLICATIONS

International Search Report and Written Opinion of PCT Application No. PCT/JP2017/003097, dated Apr. 11, 2017, 07 pages of English Translation and 08 pages of ISRWO.
(Continued)

*Primary Examiner* — Lisa S Landis
(74) *Attorney, Agent, or Firm* — Chip Law Group

(57) ABSTRACT

To provide a display body device and a display apparatus that allow for improvement of an electrostatic withstanding voltage, a display body device 10E includes: a wiring substrate 30; a light-emitting element 12 and a drive IC 13 that are disposed on the wiring substrate 30; and a wiring pattern 36 that is disposed on an outermost side, and is at least partially exposed and has a potential equal to a ground of each of the light-emitting element 12 and the drive IC 13.

11 Claims, 12 Drawing Sheets

(51) Int. Cl.
     *G09F 9/40*         (2006.01)
     *G09G 3/20*         (2006.01)
     *H01L 27/12*        (2006.01)
     *H01L 27/15*        (2006.01)
     *H01L 33/36*        (2010.01)
     *H05K 3/28*         (2006.01)

(52) U.S. Cl.
     CPC .............. *H01L 27/15* (2013.01); *H01L 33/36* (2013.01); *H05K 1/0259* (2013.01); *G09G 2300/023* (2013.01); *G09G 2300/0426* (2013.01); *G09G 2300/0439* (2013.01); *G09G 2330/04* (2013.01); *H05K 1/026* (2013.01); *H05K 3/28* (2013.01); *H05K 2201/09618* (2013.01)

(56) References Cited

FOREIGN PATENT DOCUMENTS

| | | |
|---|---|---|
| JP | 02-174289 A | 7/1990 |
| JP | 2002-324954 A | 11/2002 |
| JP | 2004-214430 A | 7/2004 |
| JP | 2004-311456 A | 11/2004 |
| JP | 2011-029176 A | 2/2011 |
| JP | 2015-197544 A | 11/2015 |
| WO | 2015/151797 A1 | 10/2015 |

OTHER PUBLICATIONS

International Preliminary Report on Patentability of PCT Application No. PCT/JP2017/003097, dated Sep. 20, 2018, 07 pages of English Translation and 05 pages of IPRP.

\* cited by examiner

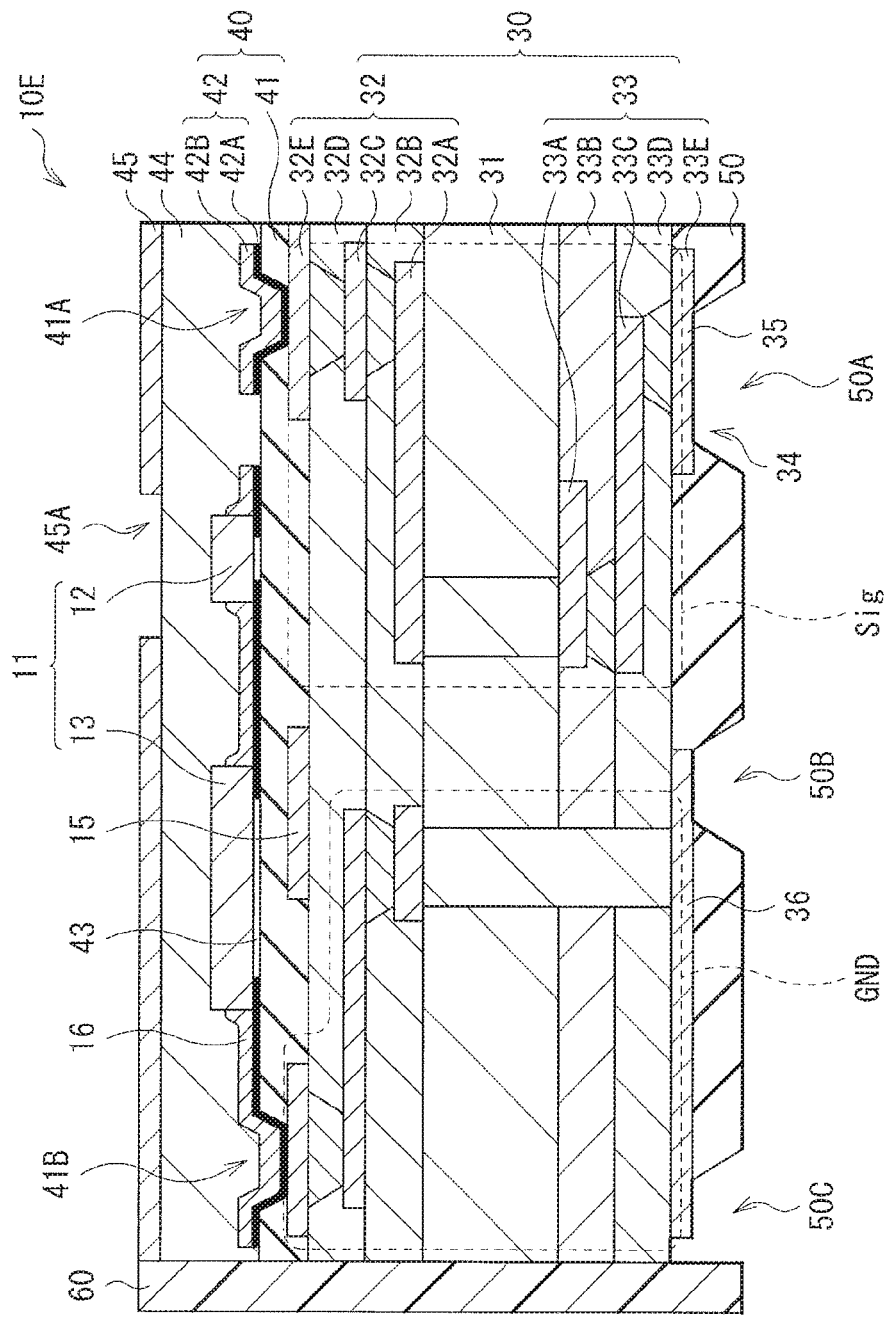
[FIG. 1]

[FIG. 2]
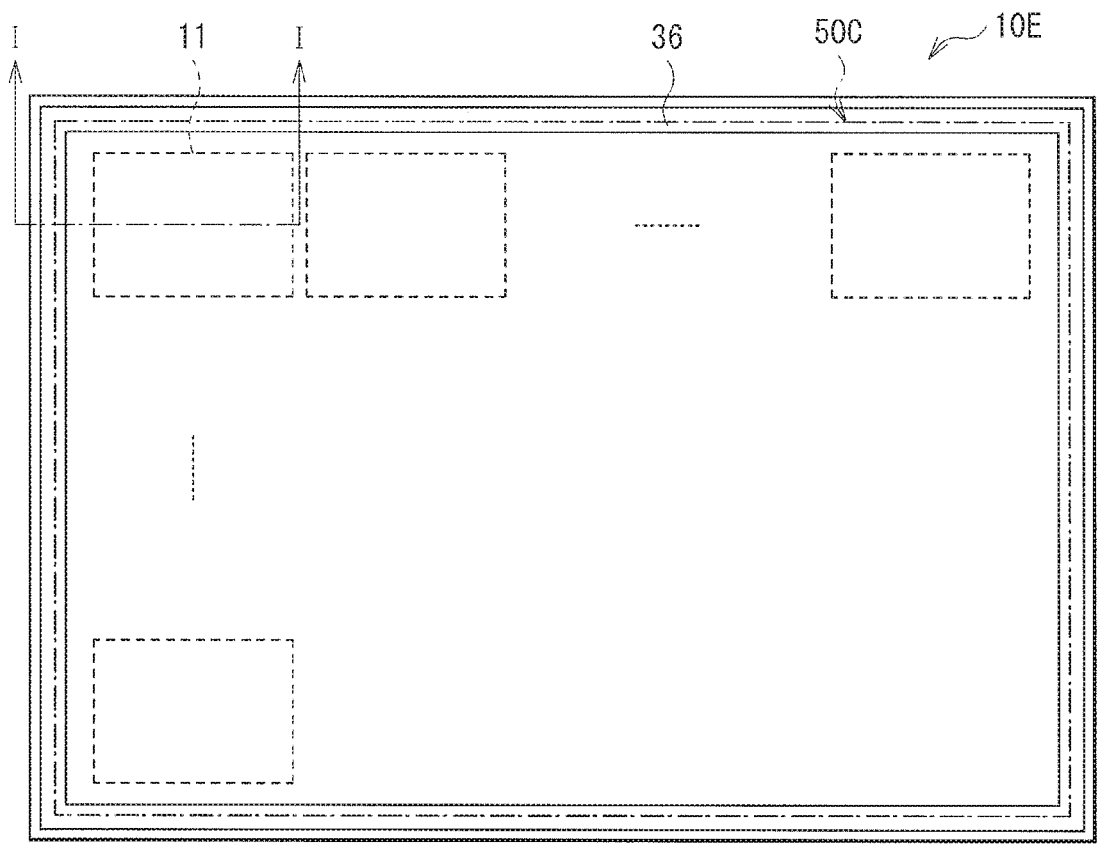
[FIG. 3]
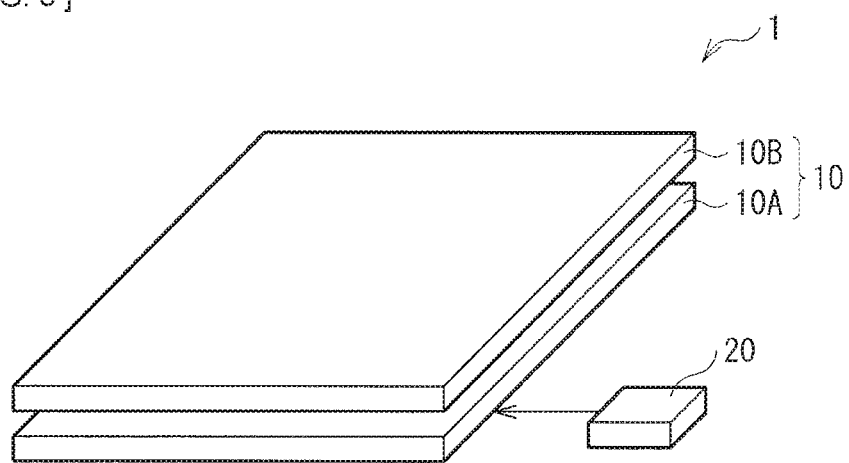

[ FIG. 4 ]
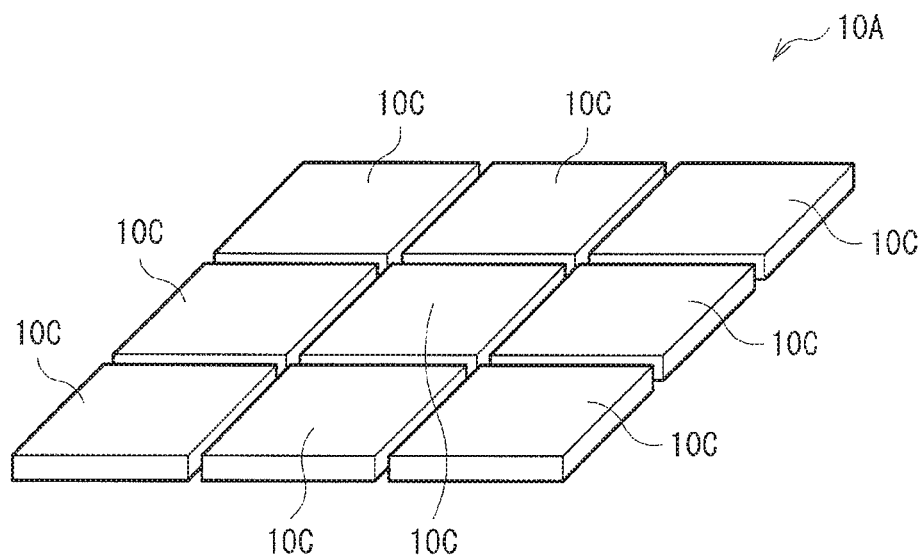
[ FIG. 5 ]
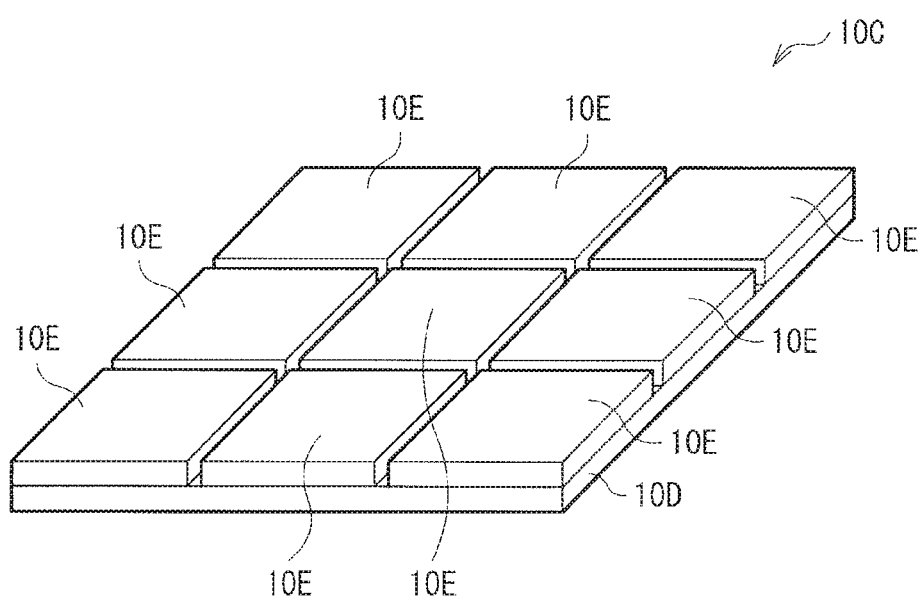

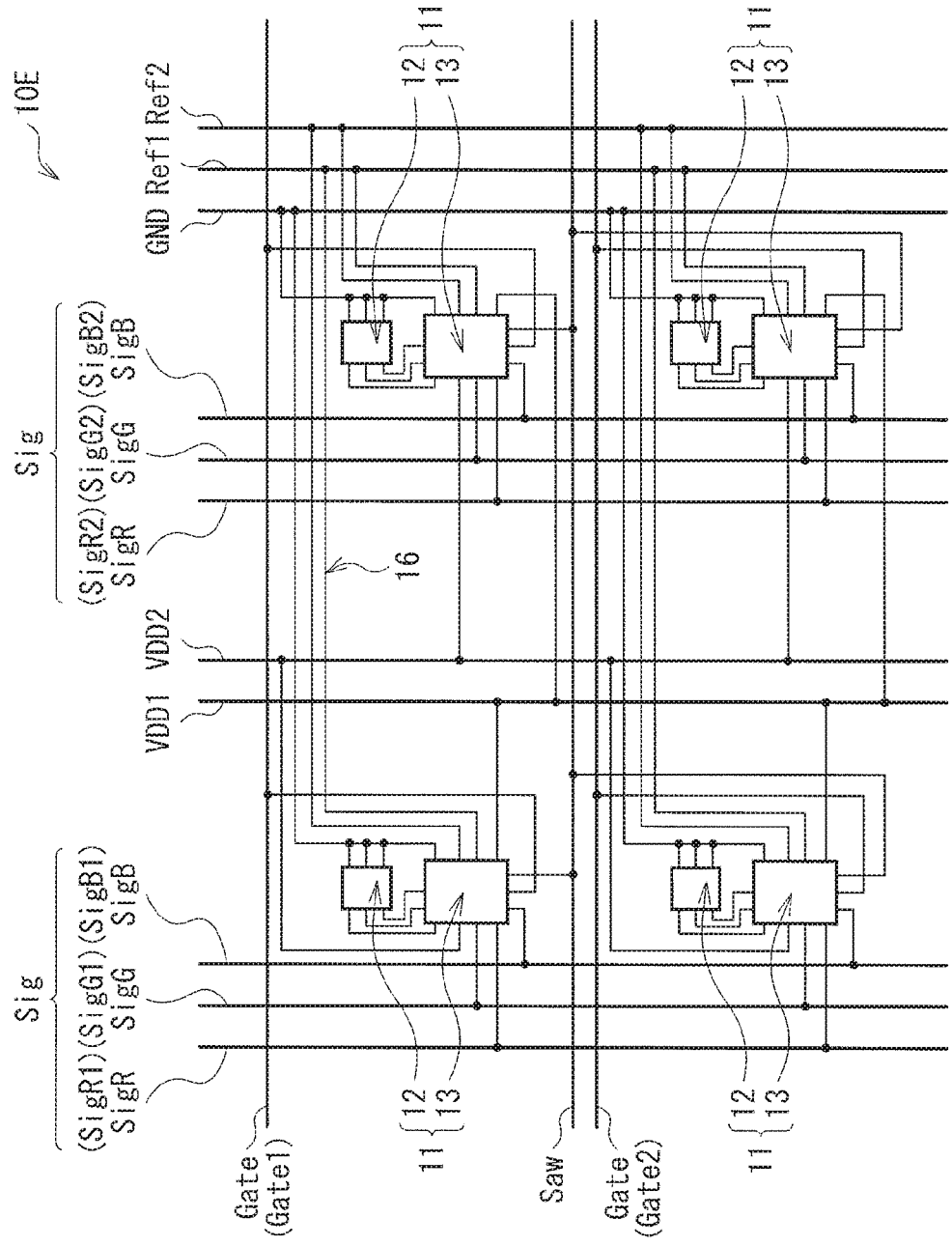
[FIG. 6]

[ FIG. 7 ]
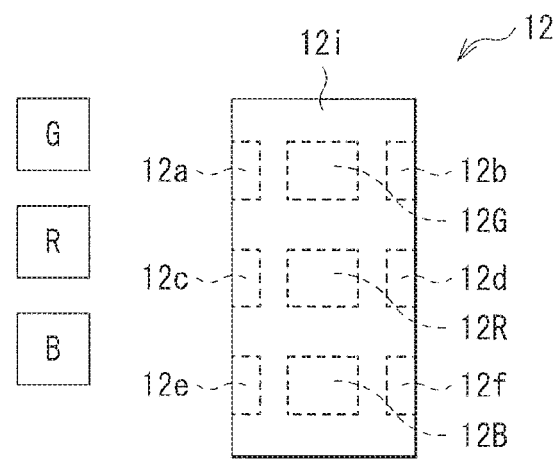
[ FIG. 8 ]
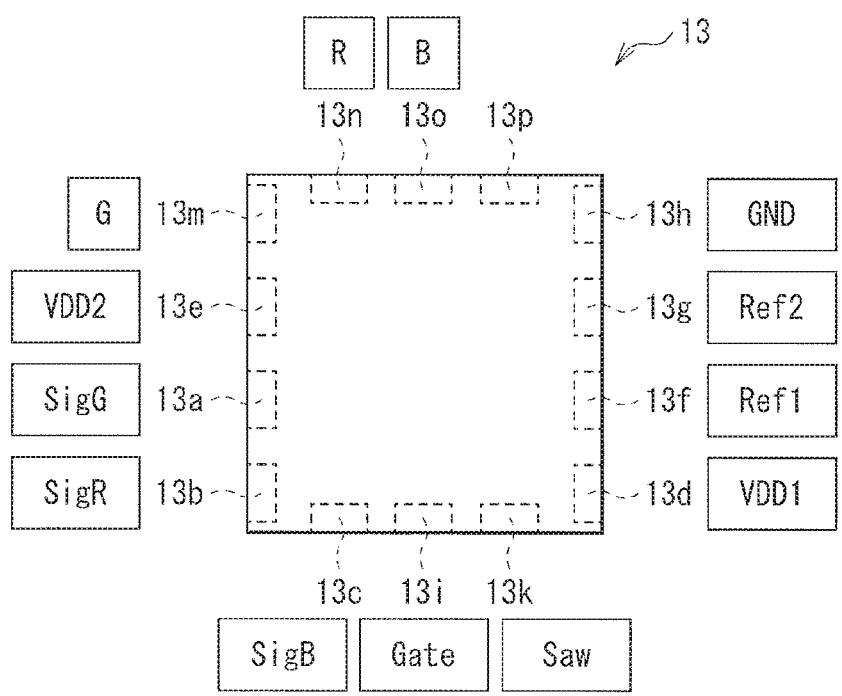

[FIG. 9]
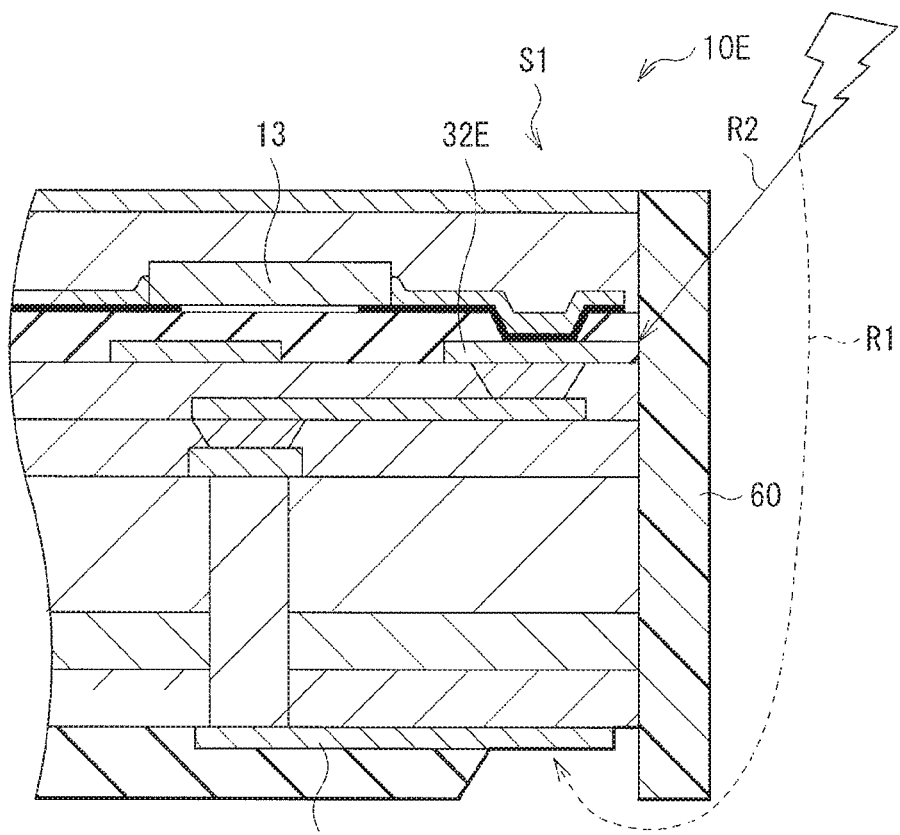
[FIG. 10]
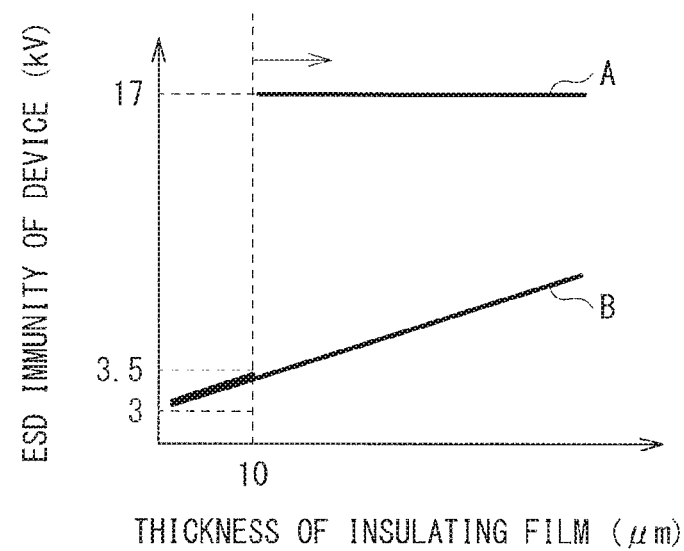

[ FIG. 11 ]
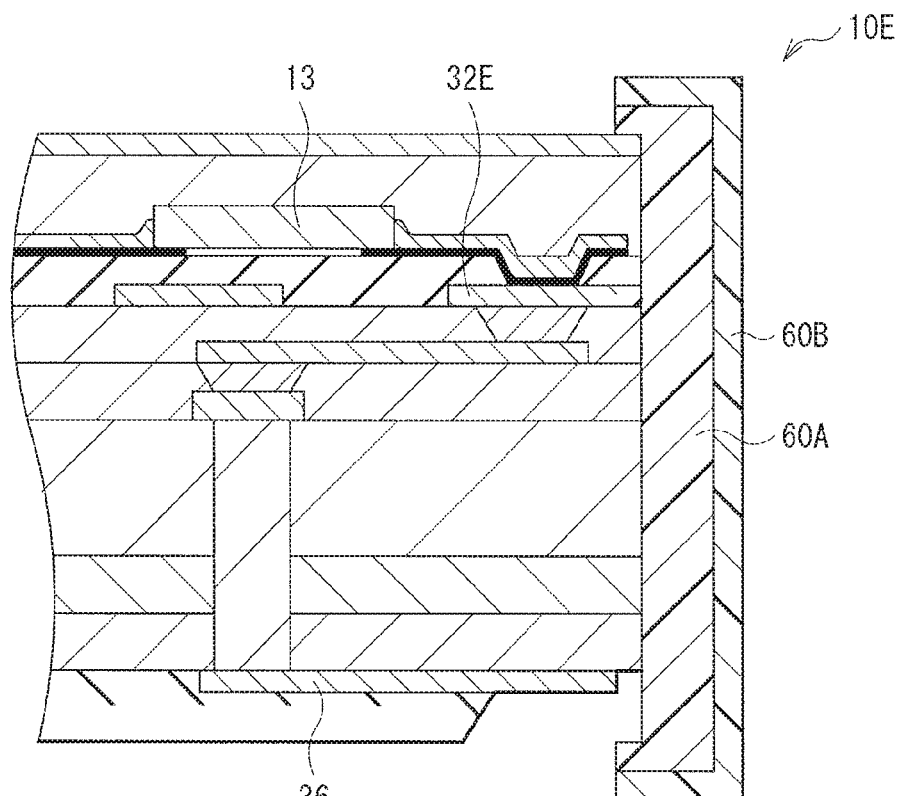
[ FIG. 12A ]
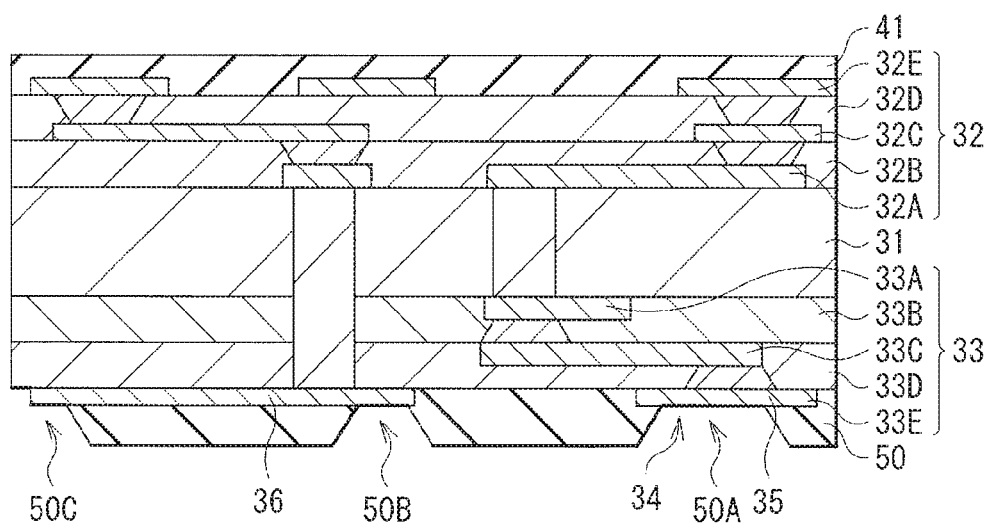

[ FIG. 12B ]
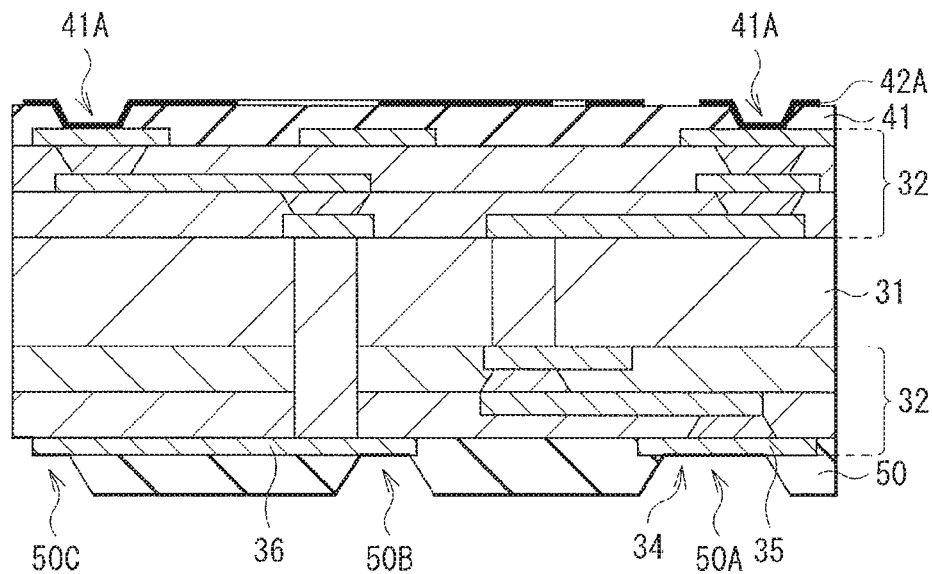
[ FIG. 12C ]
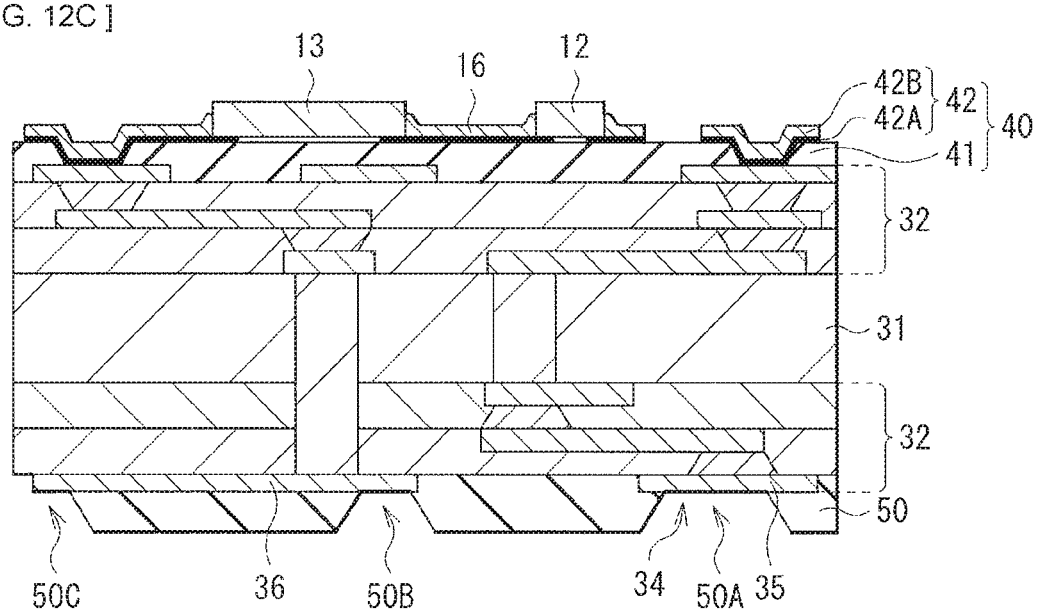

[ FIG. 13A ]
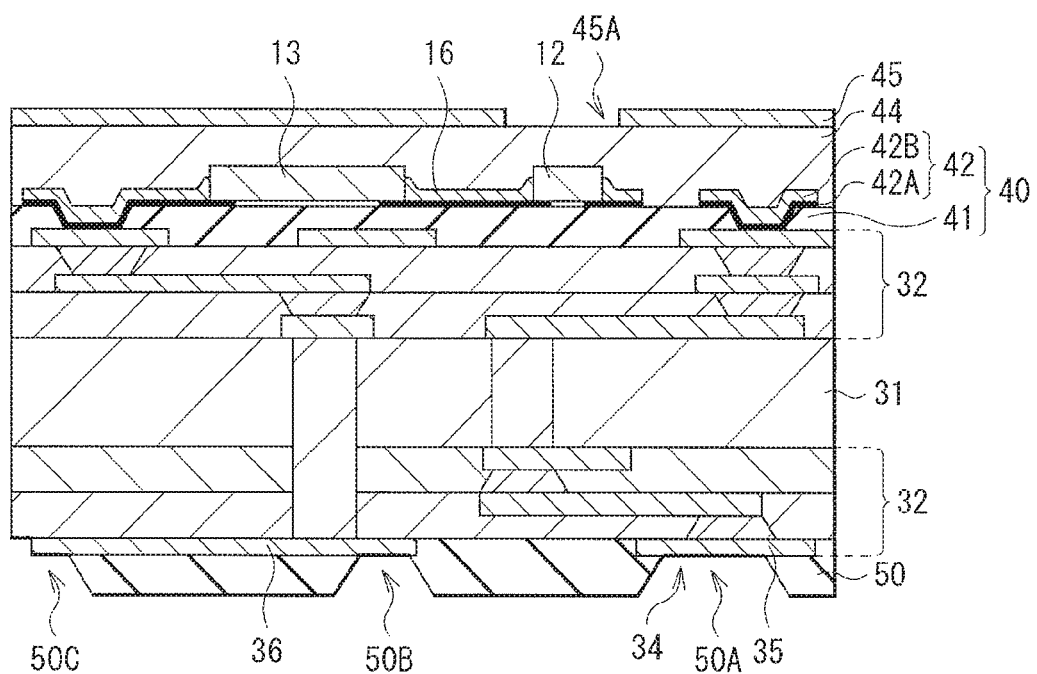
[ FIG. 13B ]
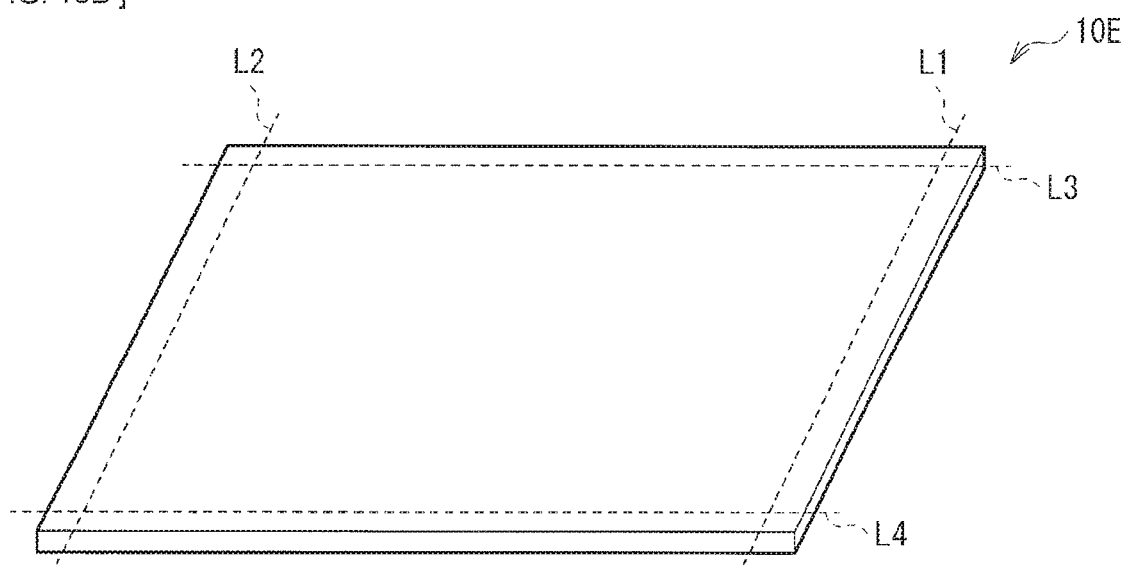

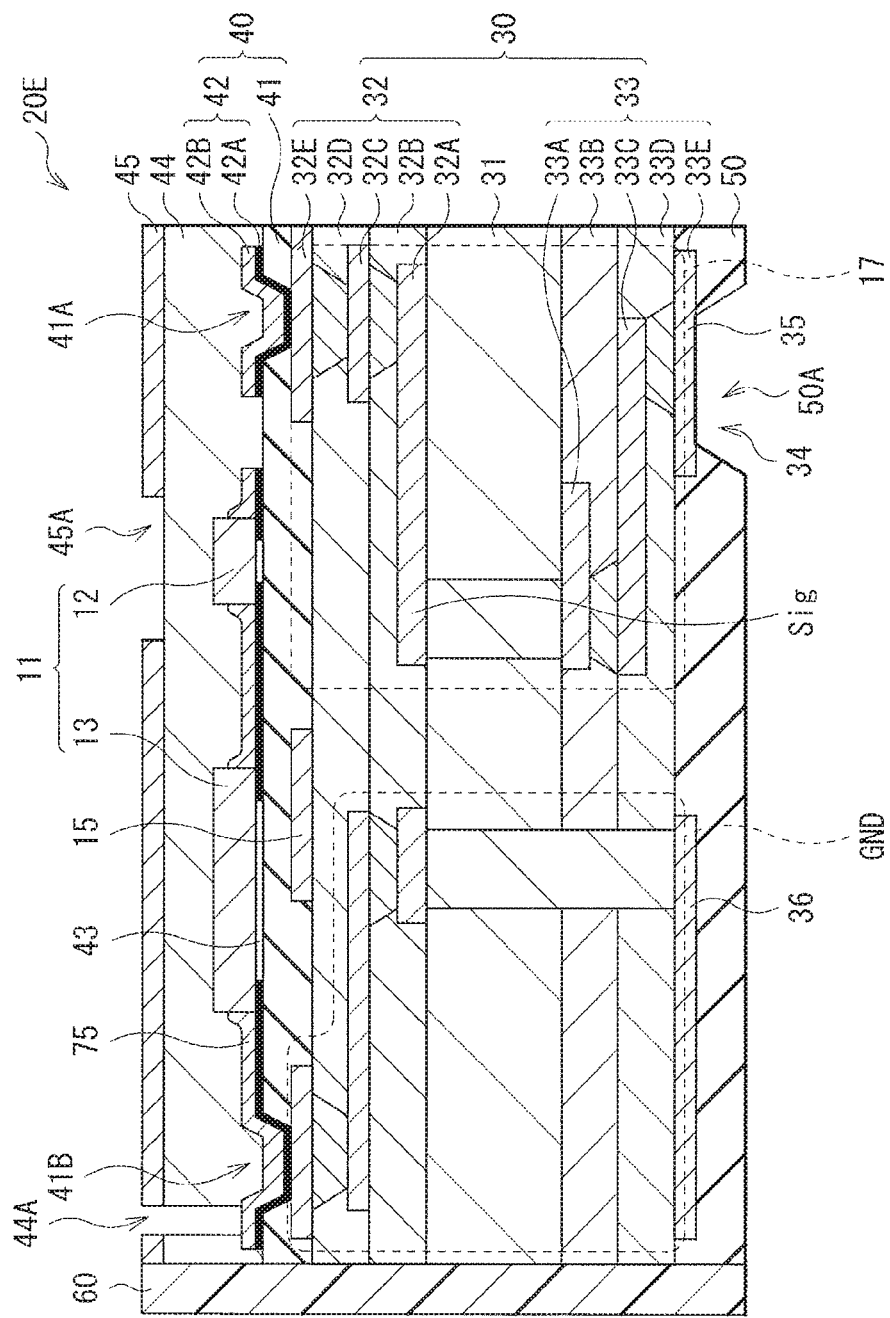

[ FIG. 14B ]
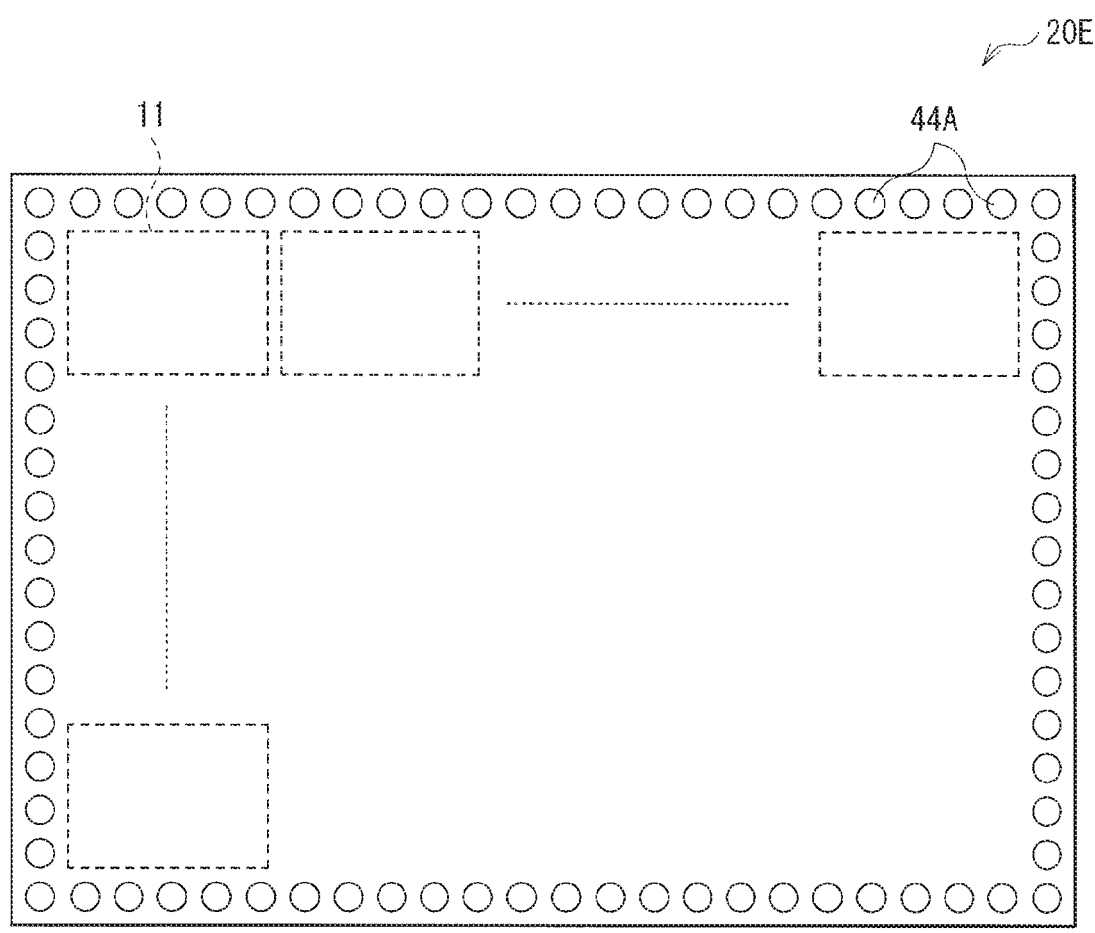

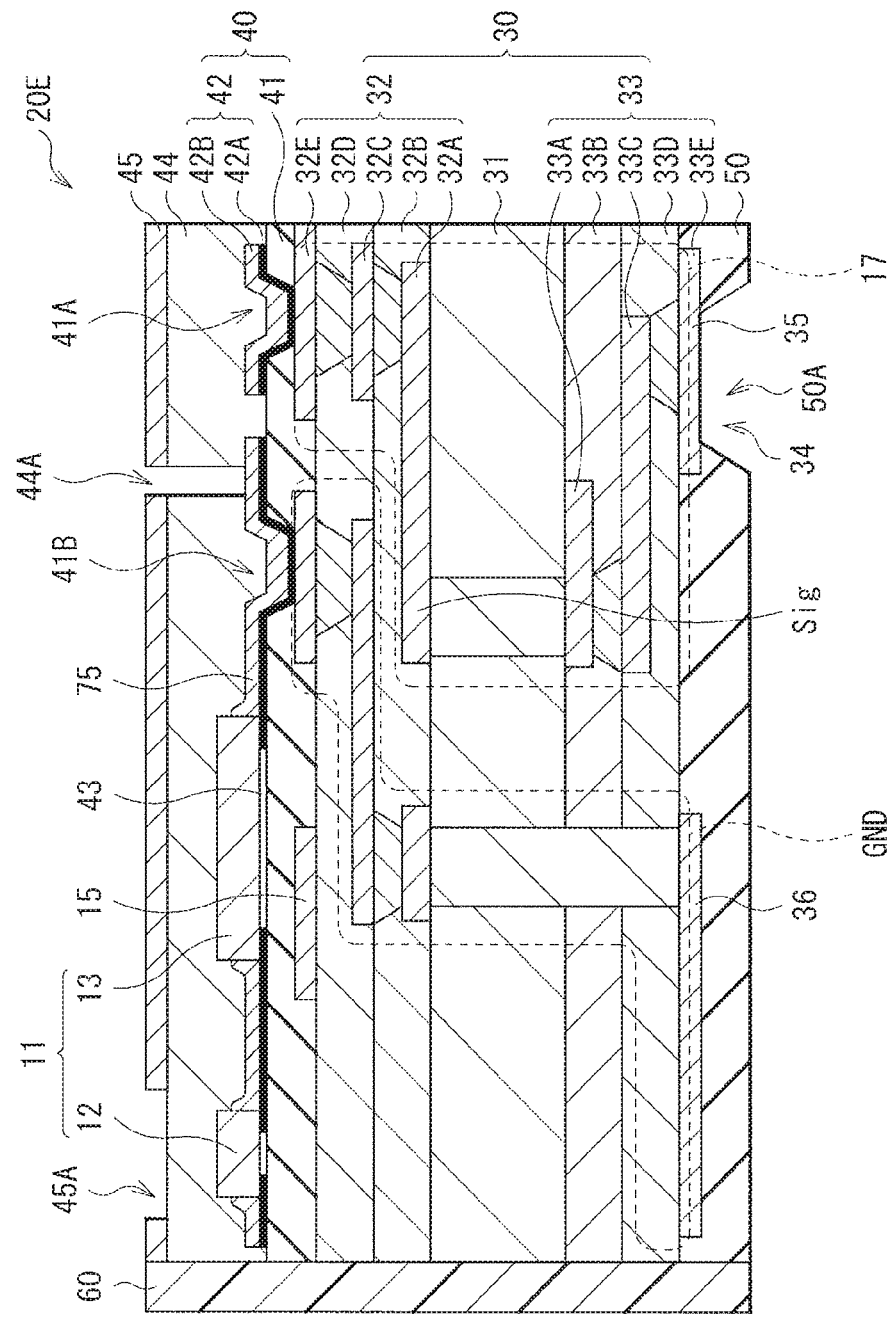
[FIG. 14C]

DISPLAY BODY DEVICE AND DISPLAY APPARATUS WITH IMPROVED ELECTROSTATIC WITHSTANDING VOLTAGE

CROSS REFERENCE TO RELATED APPLICATIONS

This application is a U.S. National Phase of International Patent Application No. PCT/JP2017/003097 filed on Jan. 30, 2017, which claims priority benefit of Japanese Patent Application No. JP 2016-044473 filed in the Japan Patent Office on Mar. 8, 2016. Each of the above-referenced applications is hereby incorporated herein by reference in its entirety.

TECHNICAL FIELD

The present disclosure relates to a display body device that configures, for example, a tiling display, etc., and to a display apparatus that includes such a display body device.

BACKGROUND ART

An image device (a display body device) that is fabricated for the purpose of achievement of a tiling display without joints includes elements disposed to the vicinity of an end thereof. For this reason, the display body device is characterized by being extremely sensitive to static electricity. Further, there is also a case where wires for plating or inspection are exposed to a side surface section of such a display body device, which also causes an issue that the elements are likely to be broken by the static electricity to be applied from the exposed wires.

In contrast, for example, PTL 1 discloses a circuit substrate in which peripheral patterns that are electrically coupled to a ground pattern on the outside of a plurality of mounted chips are provided on a top surface and a bottom surface of a substrate. Such a circuit substrate exposes a portion of the peripheral pattern that is provided on the top surface, and prevents electrostatic breakdown of the chips by causing generated static electricity to be released to an apparatus from the peripheral pattern on the top surface via the peripheral pattern on the bottom surface.

CITATION LIST

Patent Literature

PTL 1: Japanese Unexamined Patent Application Publication No. 2004-214430
PTL 2: Japanese Unexamined Patent Application Publication No. 2002-324954
PTL 3: Japanese Unexamined Patent Application Publication No. H02-174289

SUMMARY OF THE INVENTION

However, in a method described in the PTL 1, it is necessary to provide electrodes (the peripheral patterns) on an outer side of the chips; therefore, such a method is not suited for application to the display body device for the tiling display in which the elements are disposed to the vicinity of the end thereof. In addition, for example, each of PTL 2 and PTL 3 discloses a configuration of shielding peripheral electrodes and the device from one another by some kind of means as countermeasures against EMI (Electromagnetic Interference). However, it is difficult to apply these technologies to the display body device in terms of visibility. Further, in a case where these technologies are regarded as the countermeasures against ESD (Electrostatic Discharge), the technologies has difficulty in leading the applied static electricity to a grounding wire (GND) assuredly. As described above, methods of improving an electrostatic withstanding voltage of the device are available; but are not considered to be suitable for the display body device that configures the tiling display without joints and includes the elements disposed to the vicinity of the end thereof.

It is desirable to provide a display body device and a display apparatus that allow for improvement of an electrostatic withstanding voltage.

A display body device according to an embodiment of the present disclosure includes: a wiring substrate; a functional element disposed on the wiring substrate; and a first wiring pattern that is disposed on an outermost side, and is at least partially exposed and has a potential equal to a ground of the functional element.

A display apparatus according to an embodiment of the present disclosure has: one or a plurality of display body devices according to the above-described embodiment and a control circuit that controls the one or the plurality of display body devices.

In the display body device and the display apparatus according to the respective embodiments of the present disclosure, the wiring pattern (the first wiring pattern) that is at least partially exposed and has the potential equal to the ground of the functional element is provided on the outermost side of the wiring substrate on which the functional element is disposed. This makes it possible to selectively flow static electricity applied to the display body device to the first wiring pattern having the potential equal to the ground.

According to the display body device and the display apparatus of the respective embodiments of the present disclosure, the wiring pattern (the first wiring pattern) that is at least partially exposed and has the potential equal to the ground of the functional element is provided on the outermost side of the wiring substrate on which the functional element is disposed. This causes the static electricity applied to the display body device to selectively flow to the first wiring pattern, thereby flowing to the ground without flowing to the functional element. This makes it possible to provide the display body device that improves an electrostatic withstanding voltage, and the display apparatus that includes the display body device. It is to be noted that effects described here are not necessarily limited and may include any of effects described in the present disclosure.

BRIEF DESCRIPTION OF DRAWINGS

FIG. 1 is a cross-sectional view of an example of a display body device according to an embodiment of the present disclosure.

FIG. 2 is a schematic plan view of an overall configuration of the display body device illustrated in FIG. 1.

FIG. 3 is a perspective view of a configuration of a display apparatus that includes the display body device illustrated in FIG. 1.

FIG. 4 is a perspective view of a configuration of a mounting substrate illustrated in FIG. 3.

FIG. 5 is a perspective view of a configuration of a unit substrate illustrated in FIG. 4.

FIG. 6 is a diagram illustrating an example of a circuit configuration of the display body device illustrated in FIG. 1.

FIG. 7 is a diagram illustrating an example of a planar configuration of a light-emitting element illustrated in FIG. 6.

FIG. 8 is a diagram illustrating an example of a planar configuration of a drive IC illustrated in FIG. 6.

FIG. 9 is a schematic view that describes a position of electrostatic discharge.

FIG. 10 is a characteristic diagram illustrating a relationship between a thickness of an insulating film and ESD immunity in the display body device (A) of the present disclosure and a typical display body device (B).

FIG. 11 is a cross-sectional view of another example of the display body device according to the embodiment of the present disclosure.

FIG. 12A is a diagram illustrating an example of a method of manufacturing the display body device illustrated in FIG. 1.

FIG. 12B is a diagram illustrating an example of a process following the process in FIG. 12A.

FIG. 12C is a diagram illustrating an example of a process following the process in FIG. 12B.

FIG. 13A is a diagram illustrating an example of a process following the process in FIG. 12C.

FIG. 13B is a diagram illustrating an example of a process following the process in FIG. 13A.

FIG. 14A is a cross-sectional view of an example of a display body device according to a modification example of the present disclosure.

FIG. 14B is a schematic plan view of an overall configuration of the display body device illustrated in FIG. 14A.

FIG. 14C is a cross-sectional view of another example of the display body device according to the modification example of the present disclosure.

MODES FOR CARRYING OUT THE INVENTION

Hereinafter, embodiments of the present disclosure are described in detail with reference to the drawings. It is to be noted that description is given in the following order.
1. Embodiment (an example in which a wiring pattern having a potential equal to a ground is provided on a rear surface side)
   1-1. Configuration of Display Apparatus
   1-2. Configuration of Display Body Device
   1-3. Method of Manufacturing Display Body Device
   1-4. Workings and Effects
2. Modification Example (an example in which a wiring pattern having a potential equal to a ground is provided on a display surface side)

1. Embodiment

FIG. 1 illustrates a cross-sectional configuration of a display body device (a display body device 10E) according to an embodiment of the present disclosure, and FIG. 2 schematically illustrates an overall planar configuration of the display body device 10E illustrated in FIG. 1. It is to be noted that FIG. 1 illustrates a cross-section in a direction of an arrow taken along a line I-I in FIG. 1 The display body device 10E is used as a cell that configures a display apparatus (a display apparatus 1; see FIG. 3) such as a so-called tiling display, for example. The display body device 10E according to the present embodiment has a configuration in which a wiring pattern 36 (a first wiring pattern) that is partially exposed and has a potential equal to a ground is disposed on an outermost side of a multi-layer wiring substrate (a wiring substrate 30) in which a plurality of wiring patterns are provided in a multi-layered manner on a front surface and a rear surface, as illustrated in FIG. 1, for example.

(1-1. Configuration of Display Apparatus)

FIG. 3 illustrates an overall configuration of the display apparatus 1 using the display body device 10E of the present disclosure. The display apparatus 1 includes a display panel 10 and a control circuit 20 that controls the display panel 10 (specifically, the display body device 10E), as illustrated in FIG. 3, for example.

The display panel 10 is configured by stacking a mounting substrate 10A and a counter substrate 10B on each other. A front surface of the counter substrate 10B serves as an image display surface, and the display panel 10 has a display region in a central portion thereof, and a frame region serving as a non-display region on a periphery thereof. The counter substrate 10B is disposed at a position opposed to the mounting substrate 10A with a predetermined gap in between, for example. It is to be noted that the counter substrate 10B may come in contact with a top surface of the mounting substrate 10A. The counter substrate 10B includes, for example, a light transmissive substrate that allows visible light to pass therethrough, and includes, for example, a glass substrate, a transparent resin substrate, a transparent resin film, or the like.

FIG. 4 illustrates an example of a configuration of the mounting substrate 10A. The mounting substrate 10A includes a plurality of unit substrates 10C that are disposed in a tiled manner, as illustrated in FIG. 4, for example. FIG. 5 illustrates an example of a configuration of the unit substrate 10C. The unit substrate 10C includes for example, the plurality of display body devices 10E that are disposed in a tiled manner, and a support substrate 10D that supports each of the display body devices 10E. Further, each of the unit substrates 10C includes an (unillustrated) control substrate. The control substrate is electrically coupled to each of the display body devices 10E via each of electrode pads 34 to be later described, for example. The support substrate 10D includes, for example, a metallic frame (a metallic plate), a wiring substrate, or the like. In a case where the support substrate 10D includes the wiring substrate, the support substrate 10D is also able to serve as the control substrate. In such a case, at least one of the support substrate 10D and the control substrate is electrically coupled to each of the display body devices 10E (or the wiring substrate 30 to be later described) via each of the electrode pads 34.

(1-2. Configuration of Display Body Device)

The display body device 10E includes the wiring substrate 30, a fine L/S layer 40, and a plurality of pixels 11. In the wiring substrate 30, a plurality of wiring patterns are provided across a plurality of layers on a front surface and a rear surface. The fine L/S layer 40 is formed in contact with the front surface (the top surface) of the wiring substrate 30. The plurality of pixels 11 are disposed on a top surface of the fine L/S layer 40 in a matrix pattern, as illustrated in FIG. 2, for example. Each of the pixels 11 includes a light-emitting element 12, and a drive IC 13 that drives the light-emitting element 12. The light-emitting element 12 and the drive IC 13 correspond to a specific example of a "functional element" in the present disclosure. Further, the wiring substrate 30 includes, for example, a sealing layer 44, a light-shielding layer 45, an insulating layer 50, and an insulating film 60. The sealing layer 44 covers the front surface including the respective pixels 11. The light-shielding layer 45 is formed in contact with the sealing layer 44. The insulating layer 50 is formed in contact with a rear surface of the wiring substrate 30. The insulating film 60 covers an end surface (a side surface) of the display body device 10E.

The wiring substrate 30 is a laminated substrate in which interlayer electrical coupling is made through via holes, for example. The pixels 11 each of which includes, for example, the light-emitting element 12 and the drive IC 13 are provided on the top surface of the wiring substrate 30, as described above. The plurality of electrode pads 34 that serves as external terminals are provided on the rear surface of the wiring substrate 30. One or more of the electrode pads 34 are provided for each of a data line SigR1, a data line SigG1, a data line SigB1, a gate line Gate1, a gate line Gate2, a power source line VDD1, a reference voltage line Ref1, a reference voltage line Ref2, and a sawtooth voltage line Saw each of which is described later, for example. The electrode pad 34 is, for example, a portion of a wiring pattern 35. The portion is exposed by an opening 50A provided on the wiring pattern 35 of the insulating layer 50 that is formed in contact with the rear surface of the wiring substrate 30.

The wiring substrate 30 includes a plurality of through wiring patterns that electrically couple a plurality of wiring patterns 16 that are routed in the fine L/S layer 40 and the plurality of electrode pads 34 to each other. Each of the through wiring patterns is a wiring pattern penetrating through the wiring substrate 30 in a thickness direction. A certain through wiring pattern includes a wiring layer extending in a column direction in a certain layer, and a plurality of via holes penetrating through some layers in the wiring substrate 30, thereby forming a data line Sig, for example.

In the present embodiment, on the rear surface of the wiring substrate 30, the wiring pattern 36 (the first wiring pattern) is provided on an outer side of the through wiring patterns configuring the data lines Sig, etc. and the electrode pads 34, for example, in a substantial end (a peripheral portion) of the wiring substrate 30. The wiring pattern 36 is electrically coupled to the wiring pattern 16 through a certain through wiring pattern, and further has a potential equal to a ground of, for example, the light-emitting element 12 or the drive IC 13. For example, the wiring pattern 36 is formed on the same layer as a layer where the wiring pattern 35 is provided, and at least a portion thereof is exposed by the opening 50C that is provided in the insulating layer 50. Preferably, the wiring pattern 36 is provided continuously in a substantial end of the display body device 10E, as illustrated in FIG. 2. Further, the opening 50C that exposes the wiring pattern 36 is also preferably formed on the wiring pattern 36 continuously. In particular, the opening 50C is preferably opened, including the outermost end of the display body device 10E, as illustrated in FIG. 1 and FIG. 2. In other words, the wiring pattern 36 is preferably exposed along an entire periphery at the outermost end of the display body device 10E.

FIG. 6 illustrates an example of a circuit configuration in the display body device 10E. The display body device 10E includes a plurality of signal lines (data lines Sig) extending in a column direction, and a plurality of selection lines (gate lines Gate) extending in a row direction in a region opposed to the display region. The data lines Sig and the gate lines Gate are formed using copper, for example.

The display body device 10E further includes, for example, a plurality of sawtooth voltage lines Saw, a plurality of power source lines VDD1 and VDD2, a plurality of reference voltage lines Ref1 and Ref2, and a plurality of ground lines GND in the region opposed to the display region. The respective sawtooth voltage lines Saw extend in the row direction, for example. The respective power source lines VDD1, the respective power source lines VDD2, the respective reference voltage lines Ref1, the respective reference voltage lines Ref2, and the respective ground lines GND extend in the column direction, for example. One or more of the sawtooth voltage line Saw, the power source lines VDD1 and VDD2, the reference voltage lines Ref1 and Ref2, and the ground line GND may be omitted depending on a drive system. The sawtooth voltage line Saw, the power source lines VDD1 and VDD2, the reference voltage lines Ref1 and Ref2, and the ground line GND are formed using copper, for example. It is to be noted that the data line Sig, the power source line VDD1, the power source line VDD2, the reference voltage line Ref1, the reference voltage line Ref2, and the ground line GND are hereinafter collectively called column wiring lines. In addition, the gate line Gate and the sawtooth voltage line Saw are hereinafter collectively called row wiring lines.

Each of the data lines Sig is a wiring pattern to which a signal corresponding to an image signal is inputted by the control circuit 20. The signal corresponding to the image signal controls emission luminance of the light-emitting element 12, for example. The plurality of data lines Sig include, for example, wiring patterns of kinds corresponding to the number of emission colors of the light-emitting element 12. In a case where the light-emitting element 12 has, for example, three (R, G, and B) emission colors, the plurality of data lines Sig include a plurality of data lines SigR, a plurality of data lines SigG, and a plurality of data lines SigB, for example. Each of the data lines SigR is a wiring pattern to which a signal corresponding to a red image signal is inputted by the control circuit 20. Each of the data lines SigG is a wiring pattern to which a signal corresponding to a green image signal is inputted by the control circuit 20. Each of the data lines SigB is a wiring pattern to which a signal corresponding to a blue image signal is inputted by the control circuit 20.

The emission colors of the light-emitting element 12 are not limited to the three colors (R, G, and B), and may be four colors (R, G, B, and W) or more. In a case where the plurality of data lines Sig include the plurality of data lines SigR, the plurality of data lines SigG, and the plurality of data lines SigB, a set of the data lines Sig that includes one data line SigR, one data line SigG, and one data line SigB is assigned to each pixel column, for example. Depending on a drive system, the set of the data lines Sig as described above is assigned to each plurality of pixel columns. Further, depending on the drive system, the set of the data lines Sig as described above may be replaced with a single data line Sig.

Each of the gate lines Gate is a wiring pattern to which a signal that selects the light-emitting element 12 is inputted by the control circuit 20. The signal that selects the light-emitting element 12 is, for example, a signal that starts sampling of a signal inputted to the data line Sig, and causes the sampled signal to be inputted to the light-emitting element 12 to start light emission of the light-emitting element 12. One of the gate lines Gate is assigned on each pixel row for example. Each of the sawtooth voltage lines Saw is, for example, a wiring pattern to which a signal having a sawtooth waveform is inputted by the control circuit 20. The signal having the sawtooth waveform is compared with the sampled signal, and the sampled signal is inputted to the light-emitting element 12 only during a period of time when a crest value of the signal having the sawtooth waveform is higher than a crest value of the sampled signal, for example. One of the sawtooth voltage lines Saw is assigned to every two pixel rows, for example. Each of the power source lines VDD2 is a wiring pattern to which a drive current to be supplied to the light-emitting element 12 is inputted by the control circuit 20. One of the power source lines VDD2 is assigned to every two pixel columns, for example. The respective power source lines VDD1, the respective reference voltage lines Ref1, the respective reference voltage lines Ref2, and the respective ground lines GND are wiring patterns to which a fixed voltage is inputted by the control circuit 20. A ground potential is inputted to each of the ground lines GND. One of the power source lines VDD1 is assigned to every two pixel columns, for example. One of the reference voltage lines Ref1 is assigned to every two pixel columns, for example. One of the reference voltage lines Ref2 is assigned to every two pixel columns, for example. One of the ground lines GND is assigned to every two pixel columns, for example.

FIG. 7 illustrates an example of a planar configuration of the light-emitting element 12. A symbol surrounded by a square in FIG. 7 denotes that a terminal next to the symbol is electrically coupled to a terminal next to the same symbol indicated in FIG. 8 to be described later. The light-emitting element 12 is a chip-formed component that emits light of a plurality of colors. In a case where emission colors of the light-emitting element 12 are three colors (R, G, and B), the light-emitting element 12 includes, for example, a light-emitting element 12R that emits red light, a light-emitting element 12G that emits green light, and a light-emitting element 12B that emits blue light. The light-emitting elements 12R, 12G, and 12B are covered with a protector 12i that includes a resin, etc., for example.

The light-emitting elements 12R, 12G, and 12B are, for example, LED chips. Here, the LED chip has a chip size of the order of micrometers, and the size is, for example, several tens of micrometers square. The LED chip includes, for example, a semiconductor layer and two electrodes. The semiconductor layer includes a stacked configuration in which an active layer is interposed between semiconductor layers of conductivity types different from each other, and the two electrodes are disposed on a common plane (a same plane) of the semiconductor layer. The light-emitting elements 12R, 12G, and 12B may be discrete chips separated from one another, or may be a single chip common to one another.

The light-emitting element 12 includes, for example, six electrode pads 12a to 12f. In the light-emitting element 12G, one electrode is electrically coupled to an electrode pad 13m of the drive IC 13 through the electrode pad 12a and a wiring pattern 16, while the other electrode is electrically coupled to the ground line GND through the electrode pad 12b and the wiring pattern 16. In the light-emitting element 12R, one electrode is electrically coupled to an electrode pad 13o of the drive IC 13 through the electrode pad 12c and the wiring pattern 16, while the other electrode is electrically coupled to the ground line GND through the electrode pad 12d and the wiring pattern 16. In the light-emitting element 12B, one electrode is electrically coupled to an electrode pad 13p of the drive IC 13 through the electrode pad 12e and the wiring pattern 16, while the other electrode is electrically coupled to the ground line GND through the electrode pad 12f and the wiring pattern 16.

The wiring pattern 16 is a wiring pattern that electrically couples, for example, the pixels 11, and the data line Sig, the gate line Gate, the power source line VDD1, the power source line VDD2, the reference voltage line Ref1, the reference voltage line Ref2, the sawtooth voltage lines Saw, or the ground line GND to each other. The wiring pattern 16 is also a wiring pattern that electrically couples, for example, the light-emitting element 12 and the drive IC 13 to each other in the pixel 11. The wiring pattern 16 is formed by sputtering or plating, for example.

The respective wiring patterns 16 are provided in a same layer (or in a same plane). Some wiring patterns 16 of the plurality of wiring patterns 16 directly couple the pixels 11 and the above-described various row wiring lines or the above-described various column wiring lines to one another. Other wiring patterns 16 of the plurality of wiring patterns 16 include a plurality of partial wiring patterns that are formed intermittently. In each of the wiring patterns 16 that include the plurality of partial wiring patterns, respective partial electrodes are linked through one or more wiring patterns (for example, one or more relay wiring patterns 15) that are formed in a lower layer (for example, a wiring layer 32E to be described later) than the respective wiring patterns 16. The relay wiring pattern 15 is formed using copper, for example.

FIG. 8 illustrates an example of a planar configuration of the drive IC 13. A wiring pattern name surrounded by a square in FIG. 8 denotes a name of a wiring pattern that is electrically coupled to a terminal next to the wiring pattern name. The drive IC 13 controls emission of the light-emitting element 12, and includes, for example, fourteen electrode pads 13a, 13b, 13c, 13d, 13e, 13f, 13g, 13h, 13i, 13k, 13m, 13n, 13o, and 13p.

The electrode pads 13a, 13b, and 13c are electrically coupled to the data lines SigG, SigR, and SigB through the wiring pattern 16. The electrode pads 13d and 13e are electrically coupled to the power source lines VDD1 and VDD2 through the wiring pattern 16. The electrode pads 13f and 13g are electrically coupled to the reference voltage lines Ref1 and Ref2 through the wiring pattern 16. The electrode pad 13h is electrically coupled to the ground line GND through the wiring pattern 16. The electrode pad 13i is electrically coupled to the gate line Gate through the wiring pattern 16. The electrode pad 13k is electrically coupled to the sawtooth voltage lines Saw through the wiring pattern 16. The electrode pads 13m, 13o, and 13n are electrically coupled to the electrode pads 12a, 12c, and 12e of the light-emitting element 12 through the wiring pattern 16. The electrode pad 13p is not coupled to the wiring pattern 16.

The wiring substrate 30 is, for example, a buildup substrate, and includes a core substrate 31, a buildup layer 32 that is formed in contact with a top surface of the core substrate 31, and a buildup layer 33 that is formed in contact with a rear surface of the core substrate 31.

The core substrate 31 ensures rigidity of the display body device 10E, and is a glass epoxy substrate, for example. The buildup layer 32 includes one or more wiring layers, and includes, for example, a wiring layer 32A, an insulating layer 32B, a wiring layer 32C, an insulating layer 32D, and the wiring layer 32E in this order from a top surface side of the core substrate 31, as illustrated in FIG. 1. The buildup layer 33 includes one or more wiring layers, and includes, for example, a wiring layer 33A, an insulating layer 33B, a wiring layer 33C, an insulating layer 33D, and a wiring layer 33E in this order from a rear surface side of the core substrate 31, as illustrated in FIG. 1. The wiring layers 32A, 32C, 32E, 33A, 33C, and 33E are formed using copper, for example. The insulating layers 32B, 32D, 33B, and 33D are formed using an ultraviolet curable resin or a thermosetting resin, for example.

The above-described respective data lines Sig are formed to be wired from the rear surface side to the front surface side through the core substrate 31 and the buildup layer 32 from the buildup layer 33, for example. FIG. 1 illustrates how the wiring pattern 35 that is provided on the rear surface side and has the opening 50A in the front surface is electrically coupled to a wiring layer 42 through an opening 41A. The respective Gates include wiring patterns that are electrically insulated from the data lines Sig, and are formed in the relay wiring patterns 15. The respective power source lines VDD2 and the respective ground lines GND are formed from the rear surface side to the front surface side through the core substrate 31 and the buildup layer 32 from the buildup layer 33 that is different from the wiring pattern configuring each of the data lines Sig, for example. FIG. 1 illustrates how the wiring pattern 36 that is provided on the rear surface side and has an opening 50B and an opening 50C in the front surface is coupled to the wiring pattern 16 through an opening 41B, and electricity 6 extends to the vicinity of an end of the display body device 10E and is coupled to the end of the display body device 10E. It is to be noted that a portion of the wiring pattern 3 configuring the ground line GND is exposed by the opening 50C provided therein. The wiring pattern 35 and the wiring pattern 36 that are respectively exposed to the rear surface by the opening 50A and the opening 50B are electrically coupled to a ground line GND of, for example, an external drive IC or an external driving substrate through a connector or a solder.

The fine L/S layer 40 includes a wiring layer 42, and an insulating layer 41 that is provided between the wiring layer 42 and a top surface of the wiring substrate 30. The insulating layer 41 is in contact with the wiring layer 42 and the top surface of the wiring substrate 30. The wiring layer 42 is a layer including each of the wiring patterns 16. Therefore, the wiring layer 42 is formed in the fine L/S layer 40. Further, the insulating layer 41 is provided between each of the wiring patterns 16 and the top surface of the wiring substrate 30, and is in contact with each of the wiring patterns 16 and the top surface of the wiring substrate 30. The insulating layer 41 has, for example, the opening 41A at a position opposed to the data line Sig. Further, the insulating layer 41 has, for example, the opening 41B at a position opposed to the relay wiring pattern 15 that is electrically coupled to the above-described wiring pattern 36. The insulating layer 41 is formed using a VPA, for example. The VPA is generally used as a resist, and, for example, the VPA manufactured by Nippon Steel Chemical Co., Ltd. is put on the market. In a case where the insulating layer 41 is formed using the VPA, it is possible to form the openings 41A and 41B on the VPA by performing selective exposure and development on the VPA, for example.

The wiring layer 42 (the respective wiring patterns 16) includes, for example, a seed layer 42A and a plated layer 42B. The seed layer 42A comes in contact with a top surface of the wiring substrate 30 including bottom surfaces and side surfaces of the openings 41A and 41B, and the plated layer 42B comes in contact with a top surface of the seed layer 42A. The seed layer 42A serves as a plating growth surface in forming the plated layer 42B by plating in a manufacturing process. The seed layer 42A is in contact with the bottom surfaces of the openings 41A and 41B, and is electrically coupled to each of the data line Sig and the ground line GND, for example. The seed layer 42A is formed using copper, for example. The plated layer 42B is formed by plating treatment using the seed layer 42A as the plating growth surface in the manufacturing process. It is to be noted that the wiring layer 42 (the respective wiring patterns 16) may be a layer that is formed by sputtering, for example.

In forming the wiring layer 42 (the respective wiring patterns 16) by plating, bonding of the wiring layer 42 (the respective wiring patterns 16) and both the gate line Gate and the data line Sig may be carried out collectively in a process of forming the wiring layer 42 (the respective wiring patterns 16). The wiring layer 42 (the respective wiring patterns 16) is bonded, by plating, to the pixel 11 (the light-emitting element 12 and the drive IC 13), for example. In forming the wiring layer 42 (the respective wiring patterns 16) by plating, bonding of the wiring layer 42 (the respective wiring patterns 16) and the pixel 11 may be carried out collectively in the process of forming the wiring layer 42 (the respective wiring patterns 16).

An L/S (line and space) of the fine L/S layer 40 is smaller than an L/S of the wiring substrate 30. The L/S refers to the narrowest wire pitch in a plane. The L/S of the fine L/S layer 40 is smaller than an L/S of each of the plurality of signal lines (data lines Sig), the plurality of gate lines Gate, the plurality of power source lines VDD1, the plurality of reference voltage lines Ref1, the plurality of reference voltage lines Ref2, and the sawtooth voltage lines Saw. The L/S of the fine L/S layer 40 is, for example, about 25 μm. Meanwhile, the L/S of the wiring substrate 30 is, for example, about 75 μm.

The sealing layer 44 includes a light-transmissive material that allows visible light to pass therethrough, and includes, for example, a light-transmissive resin layer that allows the visible light to pass therethrough. The light-shielding layer 45 is includes a material that absorbs the visible light. The insulating layer 50 is formed using, for example, an ultraviolet curable resin or a thermosetting resin.

The light-shielding layer 45 has an opening 45A at a position opposed to each of the light-emitting elements 12. Light emitted from each of the light-emitting elements 12 is outputted to outside through each of the openings 45A.

The insulating layer 50 has openings 50A, 50B, and 50C at positions opposed to the respective electrode pads 34 (the wiring pattern 35 here) that serve as external connection terminals of the display body device 10E, and the wiring pattern 36. Therefore, the respective electrode pads 34 and the wiring pattern 36 are exposed to the rear surface of the display body device 10E (the wiring substrate 30) through the openings 50A, 50B, and 50C. It is to be noted that the electrode pad 34 and the support substrate 10D are electrically coupled to each other through a metal bump or a solder bump that is provided in the opening 50A, for example.

Further, in the present embodiment, an insulating film 60 is provided on an end surface of the display body device 10E. The insulating film 60 further improves the electrostatic withstanding voltage of the display body device 10E, and becomes effective specifically in a case where various wiring patterns (second wiring patterns) that are formed inside the wiring substrate 30 configuring the display body device 10E are exposed to the end surface. A thickness of the insulating film 60 (in a planar direction of the display body device 10E) is preferably as small as possible to achieve tiling without joints. Therefore, the insulating film 60 is preferably formed using a material having a high insulating property. Examples of such a material include an epoxy resin, an acrylic resin, polyphenylene oxide, polystyrene, butadiene styrene rubber, polyvinyl chloride, polyethylene, polypropylene, silicone, butyl rubber, polyamide, polyester, polytetrafluoroethylene, polyethylene terephthalate, polyamide, a nipoxy resin, polytrifluoroethylene chloride, a vinylidene chloride resin, a diallyl phthalate resin, an ABS resin, polyimide, etc. It is possible to form the insulating film 60 using one kind or two or more kinds of these materials.

It is to be noted that, as described above, in a case where wiring patterns (the second wiring patterns) other than the wiring pattern 36 are exposed to the side surface of the display body device 10E, the thickness of the insulating film 60 preferably establishes a relationship of A<B in a dielectric strength A in a path from a display surface S1 side to the wiring pattern 36, and a dielectric strength B in a path from the display surface S1 side to a side-surface wiring pattern (for example, the wiring layer 32E) other than the wiring pattern 36. Here, as illustrated in FIG. 9, in a case where static electricity occurs at any position, the dielectric strength A corresponds to a dielectric strength of air from a position (any position) of occurrence of the static electricity on the display surface S1 side to the wiring pattern 36. The dielectric strength B corresponds to a dielectric strength that combines air from a position (any position) of occurrence of the static electricity on the display surface S1 side to the side-surface wiring pattern other than the wiring pattern 36 with the insulating film 60. For example, in a case where the relationship of A<B is established, the static electricity that occurs at any position on the display surface S1 side flows to the wiring pattern 36 (R1). In a case where the relationship of A<B is not established, the static electricity flows to the exposed wiring pattern while causing dielectric breakdown of the insulating film 60 (R2). Here, a dielectric strength voltage of the insulating film 60 is determined by the thickness and a physical property value of a material configuring the insulating film 60. However, as seen in the present embodiment, in a case where the wiring pattern 36 exposed to the rear surface is provided, providing the insulating film 60 having a fixed thickness makes it possible to selectively discharge, to the wiring pattern 36, the static electricity arising on the display surface S1 side. Preferably, a dielectric breakdown strength voltage of the insulating film 60 is, for example, 15 kV/mm or more.

FIG. 10 illustrates a relationship between the thickness of the insulating film 60 and ESD immunity in a case where the insulating film 60 is provided on each of end surfaces of the display body device 10E of the present embodiment (A) and a display body device having a typical configuration (B). It is to be noted that the insulating film 60 uses an acrylic-type resin in this case. The typical display body device refers to a device in which various wiring patterns such as signal lines are formed on an outermost side thereof. As can be seen from FIG. 10, the ESD immunity is improved in proportion to the thickness of the insulating film 60 that is formed on the end surface in the typical display body device (B), whereas the ESD immunity is significantly improved in a case where the thickness of the insulating film 60 increases above 10 μm in the display body device 10E of the present embodiment (A). For example, even in a case where a test voltage was 17 kV, functional elements were not destroyed. It is to be noted that this result is not limited to a case where the acrylic-type resin is used as a material of the insulating film 60, and, for example, use of a material having a dielectric strength voltage substantially equal to that of the acrylic-type resin such as an epoxy-based resin ensures a similar result. Further, in a case where the insulating film 60 is formed using a material having a dielectric strength voltage higher than that of the acrylic-type resin, a necessary thickness of the insulating film 60 is reduced.

It is to be noted that the insulating film 60 may have a laminated configuration of an insulating film 60A and a black mask 60B, as illustrated in FIG. 11, for example. The black mask 60B has a function of prevent wiring patterns facing the end surface of the display body device 10E from being visible from a display surface, and shielding leakage light from the end surface. Therefore, formation of the black mask 60B on the outside of the insulating film 60A makes it possible to improve external appearance in the display body device 10E and the display apparatus 1 that is configured by combination with the display body device 10E.

(1-3. Manufacturing Method)

Next, an example of a method of manufacturing the display body device 10E is described with reference to FIGS. 12A, 12B, 12C, 13A, and 13B. Each of FIGS. 12A, 12B, 12C, 13A, and 13B illustrate an example of a manufacturing process of the display body device 10E in order of processes.

First, the wiring substrate 30 including the wiring pattern 36 with a potential equal to a ground on a substantial end of a rear surface is prepared, and the insulating layer 50 that covers the wiring pattern 35 and the wiring pattern 36 is formed on the rear surface of the wiring substrate 30, as illustrated in FIG. 12A. Thereafter, a predetermined method is used to respectively form the openings 50A and 50B at positions opposed to top surfaces of the wiring pattern 35 and the wiring pattern 36 and form the opening 50C that exposes the wiring pattern 36 on an outer end of the wiring substrate 30. Further, the insulating layer 41 is formed on a front surface of the wiring substrate 30. It is to be noted that it is possible to fabricate the wiring substrate 30 by a method similar to a generally available method of manufacturing a multi-layer wiring substrate.

Next, a predetermined method is used to respectively form the openings 41A and 41B at positions opposed to top surfaces of the ground line GND and the data line Sig in the insulating layer 41, as illustrated in FIG. 12B. At this time, although not illustrated, an opening is also formed at a position opposed to a top surface of the relay wiring pattern 15 that is electrically coupled to the partial wiring pattern by a predetermined method. Thereafter, the seed layer 42A is formed on the top surface of the wiring substrate 30 including bottom surfaces and side surfaces of the openings 41A and 41B.

Next, the light-emitting element 12 and the drive IC are fixed, and the wiring layer 42 (the respective wiring patterns 16) is formed, as illustrated in FIG. 12C. First, a fixing layer used to temporarily fix the light-emitting element 12 and the drive IC 13 is formed by application of an insulating adhesive agent to whole surfaces of the insulating layer 41 and the seed layer 42A, or the like. Instead of the adhesive agent, a layer of an adhesive agent as represented by a silicone-based or acrylic-type adhesive agent may be formed as the fixing layer. Thereafter, the light-emitting element 12 and the drive IC 13 are fixed temporarily by the fixing layer. At this time, the electrode pads 12a to 12e of the light-emitting element 12, and the electrode pads 13a to 13p of the drive IC 13 are disposed close to a metallic object (the plated layer 42B) that grows in plating treatment to be later described to a degree allowing for coupling. Next, the fixing layer other than a portion of temporarily fixing the light-emitting element 12 and the drive IC 13 (a portion existing on bottom surfaces of the light-emitting element 12 and the drive IC 13 of the fixing layer) is removed. As a result, the fixing layer 43 remains only on the bottom surfaces of the light-emitting element 12 and the drive IC 13. In removing the fixing layer, it is possible to perform dry etching, organic solvent immersion, or the like, for example. It is to be noted that the insulating adhesive agent may be beforehand applied to only a position where the light-emitting element 12 and the drive IC 13 are temporarily fixed.

Subsequently, plating treatment is performed using the seed layer 42A as a plating growth plane to form the plated layer 42B on a top surface of the seed layer 42A. This leads to formation of the wiring layer 42 (the respective wiring patterns 16). At this time, bonding of the wiring layer 42 (the respective wiring patterns 16) and both the gate line Gate and the data line Sig is carried out collectively in a process of forming the wiring layer 42 (the respective wiring patterns 16). Further, bonding of the wiring layer 42 (the respective wiring patterns 16) and the pixel 11 is carried out collectively in the process of forming the wiring layer 42 (the respective wiring patterns 16).

Next, the sealing layer 44 in which the light-emitting element 12 and the drive IC 13 are embedded is formed, and thereafter the light-shielding layer 45 is formed on the sealing layer 44, as illustrated in FIG. 13A. Subsequently, the opening 45A is formed at a position opposed to the light-emitting element 12 in the light-shielding layer 45 by a predetermined method.

Next, four sides of the wiring substrate 30 are cut as appropriate along lines $L_1$, $L_2$, $L_3$, and $L_4$, for example, and thereafter the insulating film 60 is formed on an end surface using, for example, a coating method, as illustrated in FIG. 13B. Thus, the display body device 10E illustrated in FIG. 1 is manufactured.

(1-4. Workings and Effects)

An image device (a display body device) configuring a tiling display includes a plurality of pixels disposed at equal spacing intervals in a row direction and a column direction. In such a case, a pixel pitch is preferably equal not only in each of the display body devices but also between the two adjoining display body devices. Therefore, each of the display body devices adopts a so-called multi-layer wiring configuration in which wiring layers that form wiring patterns, signal lines, etc. for driving are laminated on a front surface and a rear surface of a substrate (a core substrate) with an insulating film in between. This makes it possible to achieve tiling with unnoticeable joints that omits or minimizes a frame region where pixels are unable to be disposed, and that ensures an equally-spaced pixel pitch between the two adjoining display body devices as well. However, such a display body device includes elements disposed to the vicinity of an end, which causes an issue of being extremely sensitive to static electricity.

In contrast, in the present embodiment, the wiring pattern 36 that is at least partially exposed is provided on the substantial end of the rear surface of the wiring substrate 30. Here, the substantial end specifically refers to a position on an outermost side from the wiring pattern 35 or any other various wiring patterns that are formed on the rear surface. This makes it possible to cause the static electricity arising at any position on the display surface side to selectively flow to the wiring pattern 36. Further, in the present embodiment, the wiring pattern 36 has a potential equal to a ground of each of the light-emitting element 12 and the drive IC 13 that are mounted in the display body device 10E. This makes it possible to effectively discharge, to the ground, the static electricity having flowed to the wiring pattern 36 without causing the static electricity to flow to the light-emitting element 12 and the drive IC 13. This allows for improvement of the electrostatic withstanding voltage of the display body device 10E.

In addition, in the present embodiment, providing the insulating film 60 on the side surface of the display body device 10E makes it possible to further improve the electrostatic withstanding voltage of the display body device 10E. As far as The thickness of the insulating film 60 preferably establishes the relationship of A<B in the dielectric strength A in the path from the display surface S1 side to the wiring pattern 36, and the dielectric strength B in the path from the display surface S1 side to the side-surface wiring pattern (for example, the wiring layer 32E) other than the wiring pattern 36. Even in a case where, for example, a wiring pattern is exposed to the side surface of the display body device 10E, this makes it possible to prevent the static electricity from flowing to the exposed wiring pattern, and to cause the static electricity to selectively flow to the wiring pattern 36 that is formed on the rear surface.

2. Modification Example

FIG. 14A illustrates a cross-sectional configuration of a display body device (a display body device 20E) according to a modification example of the present disclosure. The present modification example is different from the above-described embodiment in that a wiring pattern 75 that is exposed by a through-hole 44A, and has a potential equal to a ground is provided on an outermost side of a display surface side of the display body device 20E. The through-hole 44A penetrates through the light-shielding layer 45 and the sealing layer 44, and a plurality of through-holes 44A are preferably formed in a periphery of the display body device 20E, as illustrated in FIG. 14B, for example. It is to be noted that in addition to individually forming the through-holes 44A as illustrated in FIG. 14B, some of the through-holes 44A may be continuously formed, or the through-hole 44A may be formed in a groove shape continuously surrounding the plurality of disposed pixels 11, as with the opening 50C illustrated in FIG. 2. Further, the through-hole 44A has only to be located on the substantial end, and may be formed on an inner circumference from the light-emitting element 12, as illustrated in FIG. 14C, for example. In addition, a planar shape of the through-hole 44A is not limited, and may be, for example, a circular shape as illustrated in FIG. 14B or a rectangular shape.

The display body device 20E of the present modification example is easier than the display body device 10E in the above-described embodiment in terms of manufacturing.

The present disclosure is described thus far with reference to the embodiment and the modification example; however, the present disclosure is not limited to the above-described embodiment, etc., and various modifications may be made. For example, in each of the above-described embodiment and modification example thereof, one drive IC 13 is provided for each of the light-emitting elements 12. However, one drive IC 13 may be provided for every plurality of light-emitting elements 12.

In each of the above-described embodiment and modification example thereof, for example, the counter substrate 10B may be omitted. Further, in each of the above-described embodiment and modification example thereof, one counter substrate 10B may be provided for each of the unit substrates 10C, or for each of the display body devices 10E.

In each of the above-described embodiment and modification example thereof, the light-emitting element 12 may have a single emission color. In such a case, the display body device 10E may have, for example, a color filter of a plurality of colors in the opening 45A.

In each of the above-described embodiment and modification example thereof, the light-shielding layer 45 may be omitted.

It is to be noted that the effects described in the description are merely exemplified and non-limiting, and effects of the present disclosure may be other effects.

Further, the present disclosure may have the following configurations.

(1)
A display body device, including:
a wiring substrate;
a functional element disposed on the wiring substrate; and
a first wiring pattern that is disposed on an outermost side, and is at least partially exposed and has a potential equal to a ground of the functional element.

(2)
The display body device according to (1), in which
the wiring substrate has a first surface and a second surface that are opposed to each other, and
the functional element is provided on a side on which the first surface is located, and the first wiring pattern is provided on a side on which the second surface is located.

(3)
The display body device according to (1) or (2), in which the first wiring pattern is provided continuously in a peripheral portion of the wiring substrate.

(4)
The display body device according to (2) or (3), in which an end surface of the wiring substrate is covered with an insulating film.

(5)
The display body device according to (4), in which a thickness of the insulating film establishes a relationship of A<B in a dielectric strength (A) in a path from the side on which the first surface is located to the first wiring pattern, and a dielectric strength (B) in a path from the side on which the first surface is located to a second wiring pattern provided between the first surface and the second surface of the wiring substrate.

(6)
The display body device according to (4) or (5), in which the insulating film has a light-shielding property.

(7)
The display body device according to any one of (4) to (6), in which the insulating film is a laminated film including a first insulating film having a light-shielding property and a second insulating film having an insulating property.

(8)
The display body device according to any one of (4) to (7), in which the insulating film is formed using one kind or two or more kinds selected from an epoxy resin, an acrylic resin, polyphenylene oxide, polystyrene, butadiene styrene rubber, polyvinyl chloride, polyethylene, polypropylene, silicone, butyl rubber, polyamide, polyester, polytetrafluoroethylene, polyethylene terephthalate, polyamide, a nipoxy resin, polytrifluoroethylene chloride, a vinylidene chloride resin, a diallyl phthalate resin, an ABS resin, and polyimide.

(9)
The display body device according to any one of (1) to (8), in which
the wiring substrate includes a core substrate and buildup layers, one or more of the buildup layers being formed on each of both surfaces of the core substrate, and interlayer electrical coupling of the buildup layers being performed through a via hole, and
the first wiring pattern is formed in the buildup layer.

(10)
The display body device according to any one of (1) to (9), in which the functional element includes a light-emitting element and a drive IC that controls emission of the light-emitting element.

(11)
The display body device according to (10), in which the wiring substrate includes a resin layer that covers a front surface including the light-emitting element and the drive IC.

(12)
A display apparatus provided with one or a plurality of display body devices and a control circuit that controls the one or the plurality of display body devices, the display body devices each including:
a wiring substrate;
a functional element disposed on the wiring substrate; and
a first wiring pattern that is disposed on an outermost side, and is at least partially exposed and has a potential equal to a ground of the functional element.

(13)
The display apparatus according to (12), in which the plurality of display body devices are supported by a support member.

(14)
The display apparatus according to (13), in which the support member is a metal plate.

This application is based upon and claims priority from Japanese Patent Application No. 2016-044473 filed with the Japan Patent Office on Mar. 8, 2016, the entire contents of which are incorporated herein by reference.

It should be understood that those skilled in the art could conceive various modifications, combinations, sub-combinations, and alterations depending on design requirements and other factors, insofar as they are within the scope of the appended claims or the equivalents thereof.

The invention claimed is:

1. A display body device, comprising:
a wiring substrate having a first surface and a second surface opposed to the first surface, wherein
an end surface of the wiring substrate is covered with an insulating film, and
the insulating film is a laminated film including a first insulating film having a light-shielding property and a second insulating film having an insulating property;
a functional element on the wiring substrate; and
a first wiring pattern on an outermost side of the wiring substrate, wherein
the first wiring pattern is at least partially exposed and has a potential equal to a ground of the functional element, and
the functional element is on a side on which the first surface is located, and the first wiring pattern is on a side on which the second surface is located.

2. The display body device according to claim 1, wherein the first wiring pattern is in a peripheral portion of the wiring substrate.

3. The display body device according to claim 1, wherein
a thickness of the insulating film establishes a relationship of A<B,
A is a dielectric strength (A) in a path from the side on which the first surface is located to the first wiring pattern,
B is a dielectric strength (B) in a path from the side on which the first surface is located to a second wiring pattern, and
the second wiring pattern is between the first surface and the second surface of the wiring substrate.

4. The display body device according to claim 1, wherein the insulating film comprises at least one kind selected from an epoxy resin, an acrylic resin, polyphenylene oxide, polystyrene, butadiene styrene rubber, polyvinyl chloride, polyethylene, polypropylene, silicone, butyl rubber, polyamide, polyester, polytetrafluoroethylene, polyethylene terephthalate, a nipoxy resin, polytrifluoroethylene chloride, a vinylidene chloride resin, a diallyl phthalate resin, an ABS resin, and polyimide.

5. The display body device according to claim 1, wherein
the wiring substrate includes a core substrate and a plurality of buildup layers,
at least one buildup layer of the plurality of buildup layers is on each of both surfaces of the core substrate,
interlayer electrical coupling of the plurality of buildup layers is through a via hole, and
the first wiring pattern is in the at least one buildup layer.

6. The display body device according to claim 1, wherein
the functional element includes a light-emitting element and a drive integrated circuit (IC), and
the drive IC is configured to control emission of the light-emitting element.

7. The display body device according to claim 6, wherein the wiring substrate includes a resin layer that covers a front surface including the light-emitting element and the drive IC.

8. A display apparatus, comprising:
at least one display body device; and
a control circuit configured to control the at least one display body device, the at least one display body device comprising:
a wiring substrate having a first surface and a second surface opposed to the first surface, wherein
an end surface of the wiring substrate is covered with an insulating film, and
the insulating film is a laminated film including a first insulating film having a light-shielding property and a second insulating film having an insulating property;
a functional element on the wiring substrate; and
a wiring pattern on an outermost side of the wiring substrate, wherein
the wiring pattern is at least partially exposed and has a potential equal to a ground of the functional element,
the functional element is on a side on which the first surface is located, and
the wiring pattern is on a side on which the second surface is located.

9. The display apparatus according to claim 8, further comprising a support member configured to support the at least one display body device.

10. The display apparatus according to claim 9, wherein the support member is a metal plate.

11. A display body device, comprising:
a wiring substrate having a first surface and a second surface opposed to the first surface, wherein
an end surface of the wiring substrate is covered with an insulating film;
a functional element on the wiring substrate; and
a first wiring pattern on an outermost side of the wiring substrate, wherein
the first wiring pattern is at least partially exposed and has a potential equal to a ground of the functional element,
the functional element is on a side on which the first surface is located,
the first wiring pattern is on a side on which the second surface is located,
a thickness of the insulating film establishes a relationship of A<B,
A is a dielectric strength (A) in a path from the side on which the first surface is located to the first wiring pattern,
B is a dielectric strength (B) in a path from the side on which the first surface is located to a second wiring pattern, and
the second wiring pattern is between the first surface and the second surface of the wiring substrate.

* * * * *